(12) United States Patent
Sisson

(10) Patent No.: US 10,624,219 B2
(45) Date of Patent: Apr. 14, 2020

(54) INTERACTIVE CABINETRY DOOR FOR USE WITH A CABINET BASE

(71) Applicant: Michael Sisson, Tucson, AZ (US)

(72) Inventor: Michael Sisson, Tucson, AZ (US)

(*) Notice: Subject to any disclaimer, the term of this patent is extended or adjusted under 35 U.S.C. 154(b) by 0 days.

(21) Appl. No.: 16/178,410

(22) Filed: Nov. 1, 2018

(65) Prior Publication Data
US 2019/0075664 A1 Mar. 7, 2019

Related U.S. Application Data

(63) Continuation-in-part of application No. 15/339,441, filed on Oct. 31, 2016, now abandoned.

(51) Int. Cl.
| | |
|---|---|
| H05K 5/00 | (2006.01) |
| H05K 5/03 | (2006.01) |
| H05K 5/02 | (2006.01) |
| G09G 3/20 | (2006.01) |
| G06F 3/0481 | (2013.01) |
| G06F 1/16 | (2006.01) |
| A47B 97/00 | (2006.01) |

(52) U.S. Cl.
CPC .......... *H05K 5/0017* (2013.01); *A47B 97/00* (2013.01); *G06F 1/1626* (2013.01); *G06F 1/1656* (2013.01); *G06F 1/1684* (2013.01); *G06F 3/0481* (2013.01); *G09G 3/2092* (2013.01); *H05K 5/0204* (2013.01); *H05K 5/0217* (2013.01); *H05K 5/03* (2013.01); *G09G 2354/00* (2013.01)

(58) Field of Classification Search
CPC ........ H05K 5/0017; H05K 1/18; H05K 5/023; H05K 5/0204; H05K 2201/10128; H05K 5/0217; H05K 5/03; G06F 1/1684; G06F 1/1656; G06F 1/1626; G06F 3/0481; A47B 97/00; G09G 3/2092; G09G 2354/00
See application file for complete search history.

(56) References Cited

U.S. PATENT DOCUMENTS

| | | | | |
|---|---|---|---|---|
| 3,836,221 A | * | 9/1974 | Whistler, Jr. | ........... F25D 23/04 312/237 |
| 5,173,839 A | * | 12/1992 | Metz, Jr. | ............... F21V 29/004 361/627 |
| 5,281,018 A | * | 1/1994 | Cullinan | .............. A47B 81/065 312/223.2 |

(Continued)

*Primary Examiner* — Jinhee J Lee
*Assistant Examiner* — Theron S Milliser
(74) *Attorney, Agent, or Firm* — Hayes Soloway P.C.

(57) ABSTRACT

An interactive cabinet door for use with a cabinet base includes an electronic display, comprising an electronic display screen in communication with a printed circuit board substrate (PCB). The PCB has a display data receiver. A protective cover is sized to cover substantially all of a front face of the electronic display. The protective cover and the electronic display together form an assembled screen having a peripheral edge substantially perpendicular to the front face of the electronic display and running along the entirety of the assembled screen. A support frame covers the peripheral edge of the assembled screen and is biased against the peripheral edge of the assembled screen. The support frame is flush with front and back faces of the assembled screen. At least one mounting bracket is affixed to a back side of the support frame and coupleable to the cabinet base.

20 Claims, 8 Drawing Sheets

(56) References Cited

U.S. PATENT DOCUMENTS

| | | | | |
|---|---|---|---|---|
| 6,134,906 A * | 10/2000 | Eastman | F25D 11/00 | 348/E5.128 |
| 6,359,270 B1 * | 3/2002 | Bridson | G06Q 10/107 | 219/679 |
| 6,559,882 B1 * | 5/2003 | Kerchner | H05B 6/6435 | 219/506 |
| 6,742,068 B2 * | 5/2004 | Gallagher | G06F 9/4406 | 312/249.1 |
| 6,853,399 B1 * | 2/2005 | Gilman | H04N 5/64 | 348/61 |
| 7,555,910 B2 * | 7/2009 | Oh | F16M 11/041 | 248/917 |
| 9,219,876 B1 * | 12/2015 | Umana | H04N 5/64 | |
| 9,326,407 B1 * | 4/2016 | Musolin | H05K 7/00 | |
| 9,940,884 B1 * | 4/2018 | Musolin | G09G 3/3607 | |
| 2003/0103023 A1 * | 6/2003 | Ootsuka | F25D 29/005 | 345/87 |
| 2004/0186596 A1 * | 9/2004 | Roh | F25D 29/00 | 700/19 |
| 2006/0096303 A1 * | 5/2006 | Kavounas | F25D 29/00 | 62/125 |
| 2006/0118694 A1 * | 6/2006 | Lee | F16M 11/10 | 40/711 |
| 2006/0125360 A1 * | 6/2006 | Kim | F16M 11/08 | 312/405.1 |
| 2006/0145576 A1 * | 7/2006 | Lee | F16M 11/2092 | 312/406 |
| 2006/0224050 A1 * | 10/2006 | Lee | A61B 5/021 | 600/300 |
| 2007/0044497 A1 * | 3/2007 | Roo | F25D 27/005 | 62/264 |
| 2007/0143376 A1 * | 6/2007 | McIntosh | G06Q 10/109 | |
| 2007/0247800 A1 * | 10/2007 | Smith | B60R 11/0252 | 361/679.02 |
| 2007/0290588 A1 * | 12/2007 | Oh | F16M 11/04 | 312/401 |
| 2008/0123284 A1 * | 5/2008 | Jaramillo | G06F 1/1601 | 361/679.1 |
| 2008/0165509 A1 * | 7/2008 | Kendall | F25D 23/028 | 361/735 |
| 2008/0192411 A1 * | 8/2008 | McCoy | G06F 1/1601 | 361/731 |
| 2009/0306827 A1 * | 12/2009 | Kim | F24F 11/30 | 700/275 |
| 2010/0315570 A1 * | 12/2010 | Mathew | G06F 1/1637 | 349/58 |
| 2013/0164483 A1 * | 6/2013 | Cites | B32B 17/10036 | 428/68 |

* cited by examiner

800

Provide an interactive cabinet door comprising: an electronic display, comprising an electronic display screen in communication with a printed circuit board substrate (PCB), the PCB having a display data receiver thereon; a protective cover sized to cover substantially all of a front face of the electronic display, wherein the protective cover and the electronic display together form an assembled screen having a peripheral edge substantially perpendicular to the front face of the electronic display and running along the entirety of the assembled screen; a support frame covering the peripheral edge of the assembled screen and biased against the peripheral edge of the assembled screen, wherein the support frame is flush with front and back faces of the assembled screen; and at least one mounting bracket affixed to a back side of the support frame and coupleable to a cabinet base
810

Display, on the electronic display, a cabinet state image corresponding to the appearance of the support frame and creating visual continuity from a first end of the support frame to a second end of the support frame
820

Receive image data with the display data receiver
830

Adjust at least a portion of the electronic display to display the received image data
840

Return the at least a portion of the electronic display to the cabinet state image
850

FIG. 8

INTERACTIVE CABINETRY DOOR FOR USE WITH A CABINET BASE

CROSS REFERENCE TO RELATED APPLICATION

This application is a continuation-in-part of U.S. application Ser. No. 15/339,441, "Interactive Cabinetry Door for Use with a Cabinet Base," filed Oct. 31, 2016, the entire disclosure of which is incorporated herein by reference.

FIELD OF THE DISCLOSURE

The present disclosure is generally related to electronic displays and more particularly is related to electronic displays located within cabinetry and home appliances.

BACKGROUND OF THE DISCLOSURE

Communication devices have become an integral part of society and most people today, young and old, must have a communication device or otherwise be digitally connected at almost all times. Consumers almost always have access to digital media either through smart phones, smart watches, tablets, televisions, and home computers. As the technology for these devices becomes cheaper, new uses of these devices are constantly evolving. A prime example is home interactive control and communication systems which recently have begun to evolve in a more integrated way using the aforementioned communications devices.

These systems can include home entertainment systems, home security and monitoring systems, and home resource monitoring and control systems that monitor electricity or other utility use. For example, the Ring® video doorbell that allows a home owner to monitor anyone that comes to their door by viewing a video feed of the door either viewing remotely or locally. The Lyric® T5 Wi-Fi thermostat controls room temperature based on the user's location and allows remote control of the thermostat. A particularly interesting product is the Amazon Echo® which allows a consumer to play Internet music channels, connect with other Internet websites, and control lights, switches, thermostats, or other network connected home appliances using only voice commands.

As these technologies evolve, it is only reasonable to assume more integration with home appliances and more consumer interactive control, e.g. using means beyond just the consumer's smart device, smart watch, television, tablet, and home computer. A common feature of many of these smart phones, smart watches, and tablets is the use of a type of toughened glass known by one brand as Gorilla® Glass and manufactured by Corning®. There are other competitive brands as well. This type of glass is often used as a protective layer to the more sensitive electronics of these products because of its shock-absorbent and shatter-resistant properties. As such, these types of devices can be handled by a consumer and withstand impacts, e.g. when dropped, that may otherwise damage the device if not for the use of this product. Television screens do not traditionally deploy the use of this product because televisions are not subjected to the same types of use as the smart phone, for example. However, as the integration of these devices becomes more prevalent, especially among home automation and interactive communication systems, there will be a need to incorporate durable glass with traditional devices and appliances.

As such, there is a need for a new type of display screens and accompanying support apparatuses that can be effectively used with home automation and interactive communication systems. Thus, a heretofore unaddressed need exists in the industry to address the aforementioned deficiencies and inadequacies.

SUMMARY OF THE DISCLOSURE

The present disclosure can be viewed as providing an interactive cabinet door apparatus. Briefly described, in architecture, one embodiment of the apparatus, among others, can be implemented as follows. An interactive cabinet door for use with a cabinet base includes an electronic display, comprising an electronic display screen in communication with a printed circuit board substrate (PCB). The PCB has a display data receiver. A protective cover is sized to cover substantially all of a front face of the electronic display. The protective cover and the electronic display together form an assembled screen having a peripheral edge substantially perpendicular to the front face of the electronic display and running along the entirety of the assembled screen. A support frame covers the peripheral edge of the assembled screen and is biased against the peripheral edge of the assembled screen. The support frame is flush with front and back faces of the assembled screen. At least one mounting bracket is affixed to a back side of the support frame and coupleable to the cabinet base.

In one embodiment, the support frame includes a first support frame piece and a second support frame piece. The first and second support frame pieces are coupled together to cover the entire peripheral edge of the assembled screen. In another embodiment, the first support frame piece is biased against the peripheral edge of the assembled screen at a different biasing force than the second support frame piece.

In one embodiment, the interactive cabinet door further includes a user input device. In another embodiment, the user input device is one selected from the group consisting of: a keyboard, a touchscreen, a camera, and a microphone. In another embodiment, the user input device is a mobile device.

In one embodiment, the display data receiver is in communication with a plurality of connected devices.

In one embodiment, the interactive cabinet door further includes at least one sensor selected from the group consisting of: temperature sensors, carbon monoxide sensors, carbon dioxide sensors, humidity sensors, weight sensors, motion sensors, RFID scanners, barcode scanners, microphones, and ranging detectors.

Embodiments of the present disclosure provide an interactive cabinet system. Briefly described, in architecture, one embodiment of the system, among others, can be implemented as follows. An interactive cabinet system includes an electronic display, comprising an electronic display screen in communication with a printed circuit board substrate (PCB). The PCB has a display data receiver. A protective cover is sized to cover substantially all of a front face of the electronic display. The protective cover and the electronic display together form an assembled screen having a peripheral edge substantially perpendicular to the front face of the electronic display and running along the entirety of the assembled screen. A support frame covers the peripheral edge of the assembled screen and is biased against the peripheral edge of the assembled screen. The support frame is flush with front and back faces of the assembled screen. A cabinet base includes a plurality of cabinet walls, a cabinet top, and a cabinet bottom all joined to create a hollow enclosure having an opening sized to allow the support frame and assembled screen to cover the opening. At least one mounting bracket is affixed to a back side of the support frame and coupleable to the cabinet base. A power source is in electronic communication with the electronic display.

In one embodiment, the support frame includes a first support frame piece and a second support frame piece. The first and second support frame pieces are coupled together to cover the entire peripheral edge of the assembled screen. In another embodiment, the first support frame piece is biased against the peripheral edge of the assembled screen at a different biasing force than the second support frame piece.

In one embodiment, the interactive cabinet system further includes a user input device. In another embodiment, the user input device is one selected from the group consisting of: a keyboard, a touchscreen, a camera, and a microphone. In another embodiment, the user input device is a mobile device.

In one embodiment, the display data receiver is in communication with a plurality of connected devices.

In one embodiment, the interactive cabinet system further includes at least one sensor selected from the group consisting of: temperature sensors, carbon monoxide sensors, carbon dioxide sensors, humidity sensors, weight sensors, motion sensors, RFID scanners, barcode scanners, microphones, and ranging detectors.

The present disclosure can also be viewed as providing methods of displaying image data on an interactive cabinet door. In this regard, one embodiment of such a method, among others, can be broadly summarized by the following steps: providing an interactive cabinet door comprising: an electronic display, comprising an electronic display screen in communication with a printed circuit board substrate (PCB), the PCB having a display data receiver thereon; a protective cover sized to cover substantially all of a front face of the electronic display, wherein the protective cover and the electronic display together form an assembled screen having a peripheral edge substantially perpendicular to the front face of the electronic display and running along the entirety of the assembled screen; a support frame covering the peripheral edge of the assembled screen and biased against the peripheral edge of the assembled screen, wherein the support frame is flush with front and back faces of the assembled screen; and at least one mounting bracket affixed to a back side of the support frame and coupleable to a cabinet base; displaying, on the electronic display, a cabinet state image corresponding to the appearance of the support frame and creating visual continuity from a first end of the support frame to a second end of the support frame; receiving image data with the display data receiver; adjusting at least a portion of the electronic display to display the received image data; and returning the at least a portion of the electronic display to the cabinet state image.

In one embodiment, the portion of the electronic display adjusted to display the received image data is less for image data corresponding to a text communication than for image data corresponding to a video.

In one embodiment, the electronic display returns to the cabinet state image after a predetermined timeout count.

In one embodiment, the electronic display returns to the cabinet state image after a user indicates they have finished interacting with the electronic display.

These and other aspects, objects, features and advantages of the example embodiment will become apparent to those having ordinary skill in the art upon consideration of the following detailed description of illustrated example embodiments.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 8 is a flowchart showing a method of displaying image data on an interactive cabinet door, in accordance with a third embodiment of the present disclosure.

DETAILED DESCRIPTION

Figure 1:
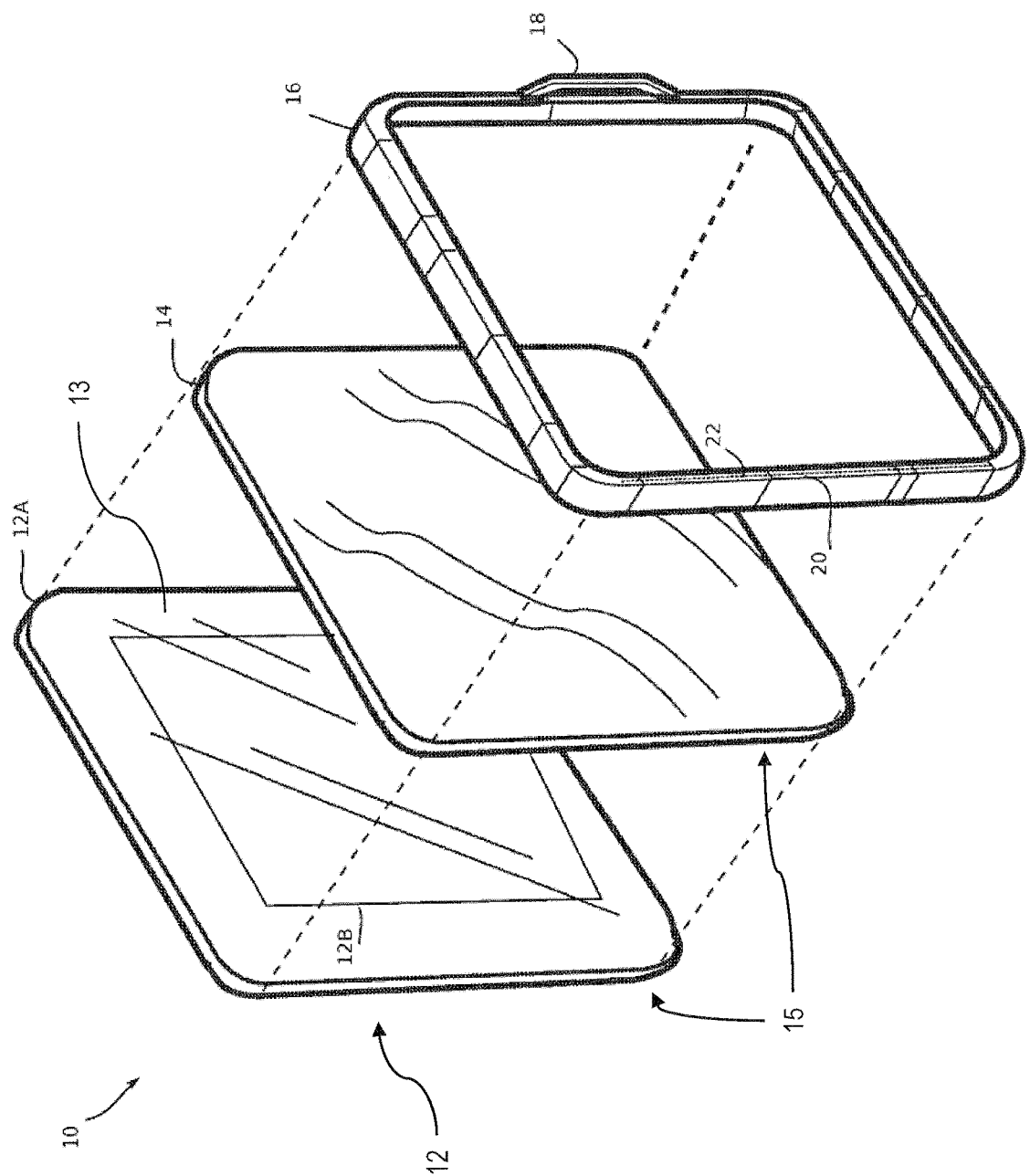
FIG. 1 is an exploded view of an interactive cabinet door, in accordance with a first exemplary embodiment of the present disclosure.

FIG. 1 is an exploded view of an interactive cabinet door 10, in accordance with a first exemplary embodiment of the present disclosure. The interactive cabinet door 10 includes an electronic display 12, comprising an electronic display screen 12B in communication with a printed circuit board substrate (PCB) 12A. The PCB 12A has a display data receiver, shown in FIGS. 2 and 5, below. A protective cover 14 is sized to cover substantially all of a front face 13 of the electronic display 12. The protective cover 14 and the electronic display 12 together form an assembled screen having a peripheral edge 15 substantially perpendicular to the front face 13 of the electronic display and running along the entirety of the assembled screen. A support frame 16 covers the peripheral edge 13 of the assembled screen and is biased against the peripheral edge 13 of the assembled screen. The support frame 16 is flush with front and back faces of the assembled screen. At least one mounting bracket is affixed to a back side of the support frame and coupleable to the cabinet base.

The electronic display 12 includes a printed circuit board substrate (PCB) 12A and electronic display screen 12B. The PCB 12A is an electronic communications apparatus capable of communicating electronic signals from a source, such as a central application server, over a communications interface, such as a wireless Wi-Fi interface, and interfacing the received data with the display screen 12B. The PCB 12A may include integrated circuit components, such as capacitors, resistors, transistors, and the like. The PCB 12A may also include a computer processor and computer-readable memory thereon. The computer processor may be a single processor, multiple processors, distributed computing system, and the like. The computer processor may access display data sources, interpret display data, process input data from a user, and the like. In one example, the PCB 12A includes a display data receiver for connecting to a display data source and receiving display data. The PCB 12A may further include additional electronic components for receiving, processing, and displaying digital images and videos. This is discussed in FIGS. 2-3, below.

The display screen 12B is a Liquid Crystal Display (LCD), e.g. a plasma display screen, a Light Emitting Display (LCD) screen, or an Organic Light Emitting Display (OLED) screen, for displaying digital images and information from PCB substrate 12A received from the other source. The display screen 12B and the PCB 12A may be substantially planar, and may be joined together when the interactive cabinet door 10 is assembled. The display screen 12B and PCB 12A may be adhesively joined by an epoxy or adhesive used for joining electronic components. This may increase the structural strength of the electronic display 12 when assembled and in use. The planar size of the display screen 12B may be less than or equal to the planar size of the PCB 12A. In one example, the display screen 12B may cover substantially all of the face of the PCB 12A.

The interactive cabinet door 10 further includes a protective cover 14 sized to cover substantially all of the front face 13 of the electronic display 12. The protective cover 14 may be made from a durable shock-absorbent and shatter-resistant glass, such as alkali-aluminosilicate glass. In another example, the protective cover 14 may be made from transparent plastics, ceramics, polymers, or any combination thereof. The protective cover 14 may be adhesively coupled to the electronic display 12 using glue, adhesive, or epoxy. In one example, the protective cover 14 may biased against the electronic display 12 using one or more fasteners, latches, clips, and the like.

The electronic display 12 and the protective cover 14 may both be substantially planar, and may form an assembled screen having a peripheral edge 15 substantially perpendicular to the front face 13 of the electronic display 12. The peripheral edge 15 may be the width of the electronic display 12 and the protective cover 14 combined, and may run along the entire periphery of the assembled screen. Depending on the construction, when assembled, the PCB 12A or the protective cover 14 may provide the primary structural strength for the interactive cabinet door 10. For example, if the protective cover 14 is made from a thick, durable plastic, it may provide more structural strength than the PCB 12A. This may be useful in cabinet applications where the cabinet door 10 is likely to be handled roughly, such as in commercial applications, industrial settings, cabinets within reach of children, and the like.

In one example, when forming the peripheral edge 15, the protective cover 14 may only contact the front face 13 of the electronic display 12. The protective cover 14 may not wrap around to cover or contact any portion of the peripheral edges or rear face of the electronic display 12. The protective cover 14 may not have a larger surface area than the front face 13 of the electronic display 12. This is useful for maintaining structural strength of the assembled screen and for giving the appearance of a unitary construction, as discussed further below.

A support frame 16 covers the peripheral edge 15 of the assembled screen. The support frame 16 may be made from any material commonly used for framing, including wood, metal, ceramic, glass, plastics, polymers, or any combination thereof. The support frame material may be dependent on the intended use and the aesthetic design of the interactive cabinet door 10. For example, wooden frame material may be commonly used in residential housing to match the aesthetic of kitchen or bathroom cabinets. A plastic frame may be used in industrial or commercial areas due to its durability and ease of care. The support frame 16 may be biased against the peripheral edge 15 of the assembled screen, meaning it may be in forceful contact with the peripheral edges of the electronic display 12 and the protective cover 14. In one example, the forceful contact from the support frame 16 may join the PCB 12A, display screen, and protective cover 14 together. The support frame 16 may be further adhesively coupled with the protective cover 14 and PCB 12A.

Figure 3:
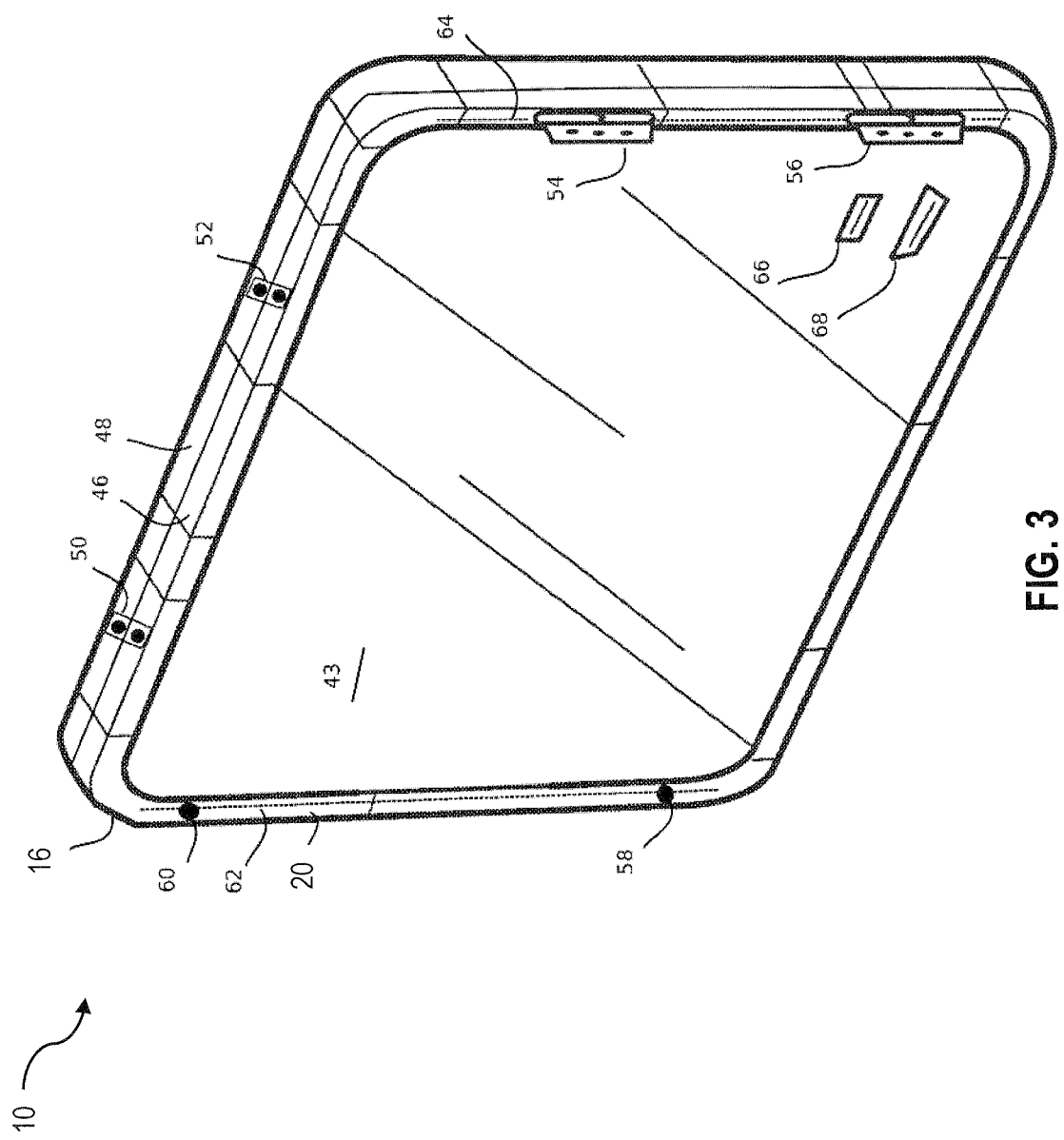
FIG. 3 is a perspective backside view of the interactive cabinet door, in accordance with the first embodiment of the present disclosure.

In one example, the support frame 16 may only contact and cover the peripheral edge of the electronic display, as shown in FIG. 3, and not the front face 13 or the rear face. This may allow the interactive cabinet door 10 to have an aesthetic design more closely resembling a traditional cabinet door. The support frame 16 may be flush with the front and back faces of the screen when assembled, with no or substantially no lip or edge between the faces and the support frame 16. This may allow the cabinet door 10 to appear to be made from a single piece and may more closely resemble a traditional cabinet door.

In one example, the support frame 16 may include a handle 18, knob, or other grasping hardware. This may allow a user to open the interactive cabinet door 10 without touching the protective cover or the PCB 12A. The handle 18 may be affixed to the support frame 16 to provide increased structural integrity when in use. In one example, the handle 18 may be formed or manufactured as a unitary piece with the support frame 16. The handle 18 may be fixed to the support frame 16 along a peripheral front sidewall 20 of the support frame 16.

It should also be understood that the sidewall portion 20 may interiorly include a spacer section 22 between the peripheral edge 15 and interior walls of the support frame 16. The spacer section 22 is useful for securely positioning the protective glass cover 14 and PCB 12A. In one example, the spacer section 22 may be made from an elastically deformable material, such as foam, rubber, soft plastic, and the like. The spacer section 22 may provide resistance against the peripheral edge 15 of the assembled screen when the interactive cabinet door 10 is assembled, improving the support frame 16's peripheral hold on the screen without applying destructive force to the components therein.

Figure 2:
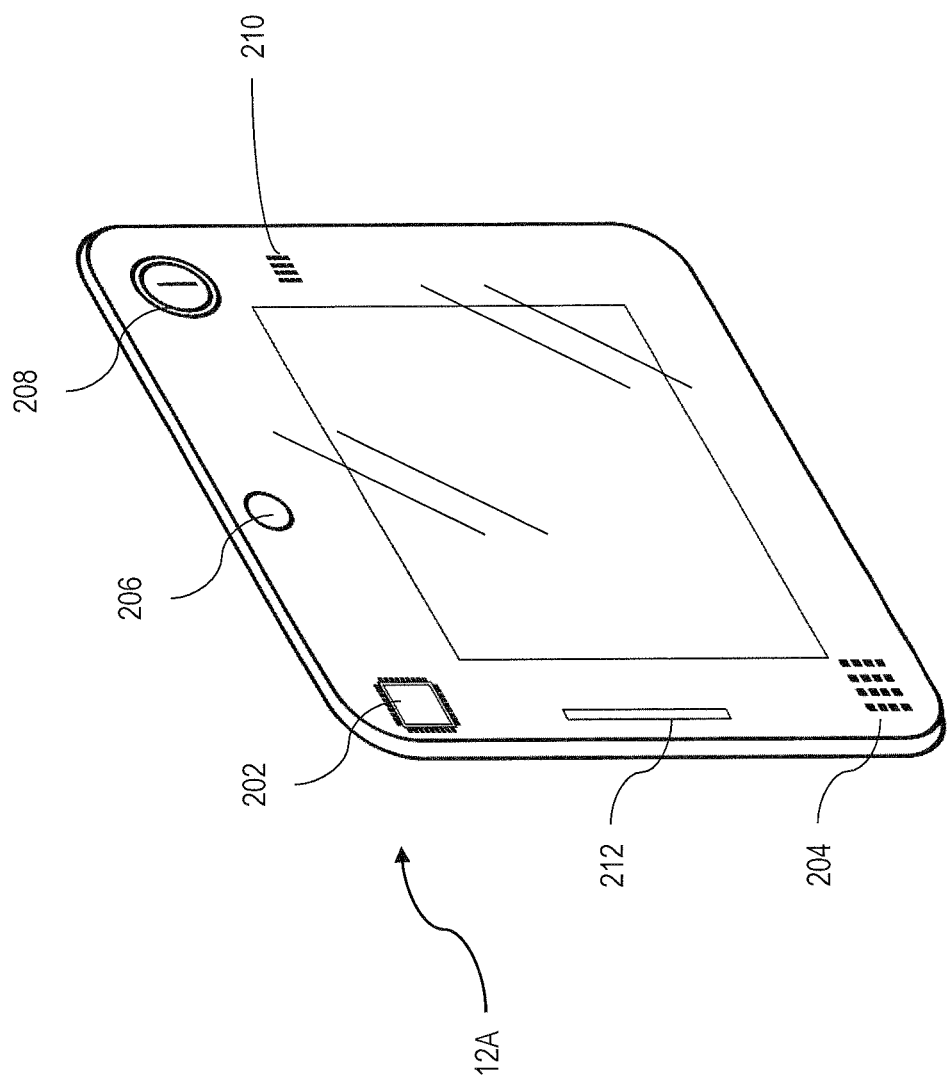
FIG. 2 is a perspective view of the PCB of the interactive cabinet door, in accordance with the first exemplary embodiment of the present disclosure.

FIG. 2 is a perspective view of the PCB 12A of the interactive cabinet door, in accordance with the first exemplary embodiment of the present disclosure. The PCB 12A may include a computer processor 202 for processing display data information and electronic communications. A data receiver 212, such as an antenna, may receive display data from wireless or remote sources. The data receiver 212 may additionally transmit data from the cabinet door 10 to the wireless or remote sources. In some embodiments, the PCB 12A may include electronic components that assist in the display and playback of images and video. For example, the PCB 12A may include integrated audio speakers 204 for playing audio from videos, playing notifications and alerts, and the like. In another example, the PCB 12A may include notification lights, such as LEDs 206. A camera 208 or microphone 210 may record user commands or user actions. The PCB 12A may, alternatively, connect to external cameras, speakers, microphones, and the like by wired connection or wireless connections, such as Wi-Fi®, Bluetooth®, and the like.

FIG. 3 is a perspective backside view of the interactive cabinet door 10 ("cabinet door"), in accordance with the first embodiment of the present disclosure. The cabinet door 10 includes the support frame 16 and assembled screen 43 that includes the PCB 12A, display screen 12B, and protective cover 14, as shown in FIG. 1. In one example, the support frame 16 may be formed from two or more pieces fixed together during assembly. For example, FIG. 3 shows the support frame 16 including a back support frame 46 and a front support frame 48 that can be coupled together in order to secure the assembled screen 43 using adhesive or fasteners 50, 52, e.g. brackets, clips, screws or rivets. In one example, the front support and back support frames 48, 46 may be coupled along a top edge of the support frame 16 The back support frame 46 may be sized and shaped to fit around the peripheral edge of the PCB 12A to hold it firmly within the frame 46. The front support frame 48 may be sized and shaped to fit around the peripheral edge of the protective cover 14. The back and front support frames 46, 48 may hold the PCB 12A and protective cover 14 with different levels of force, depending on the strength of the material used in the PCB 12A and protective cover 14. For example, when the protective cover 14 is made from a strong, durable plastic, the front support frame 48 may hold the protective cover 14 with a higher level of force than the back support frame 46 may apply to the PCB 12A. If the electronic display 12 and protective cover 14 are adhesively coupled together, then this may allow the support frame 16 to apply a firmer hold to the assembled screen 43 than if both the front and back support frame components applied the same amount of force. In turn, the structural strength of the cabinet door 10 may be increased. In another example, the support frame 16 may include top and bottom pieces or left and right pieces. In another example, the support frame 16 may include three or more pieces. Pieces located at structurally important portions of the cabinet door 10 may be reinforced. For example, pieces of the support frame 16 located near the mounting brackets 54, 56, handle, or corners may be stronger in order to withstand more robust use conditions.

At least one mounting bracket 54, 56 is affixed to a back side of the support frame 16 and coupleable to the cabinet base (not shown). FIG. 3 shows two mounting brackets 54 and 56 attached to the rear sidewall 20 of the support frame 16. Specifically, the mounting brackets 54, 56 are not attached to the assembled display 43, including to the PCB 12A or protective cover 14. Nor are the mounting brackets 54, 56 attached to the outer portion of the support frame 16. In this example, attachment to the rear sidewall 20 of the support frame allows the cabinet door 10 to move freely while maintaining structural strength. The at least one mounting bracket 54, 56 may be any mounting hardware useful for mounting a cabinet door 10, including a hinge, hook, and the like.

The cabinet door 10 may also include bumpers 58, 60 made of plastic or rubber adhesively fixed to a peripheral of the side wall 20. The bumpers 58, 60 being used to cushion the cabinet door 10 against the cabinet base when opening and closing. As shown from the front perspective in FIG. 1, the support frame 16 may include an interior portion 62, 64 along the peripheral sides of the sidewall 20 that separates the interior of the support frame 16 into a spacer area 62 for cushioning the assembled screen 43 and a divider section 64 that can be used to mount the handle and at least one mounting bracket 54, 56.

The cabinet door 10 may include one or more display data receivers for communicating display data to the electronic display 12. FIG. 2 showed one or more wireless display and other information between the cabinet door and a wireless or remote device. FIG. 3 shows hardware ports, such as a High-Definition Multimedia Interface (HDMI) 68 and a Universal Serial BUS (USB) port 66. The ports 66, 68 allow the cabinet door 10 to make a wired data connection to an external imaging device or video player, such as a cable box, digital video recorder (DVR), video stick (like a Google Chromecast® or Amazon Fire Stick®), computer, DVD or Blu-ray player, and the like. The USB port 66 may allow a USB flash drive or other data sources to be connected to the cabinet door 10. Electrical power for the cabinet door 10 may be provided over the HDMI or USB ports 66, 68. Other ports may be included as well, including USB-C, micro USB, Lightning, DisplayPort, eSATA, Ethernet, and A/C power adapter ports. The various ports may be in electrical communication with the electrical and computer components of the cabinet door 10 on the PCB 12A.

Figure 4:
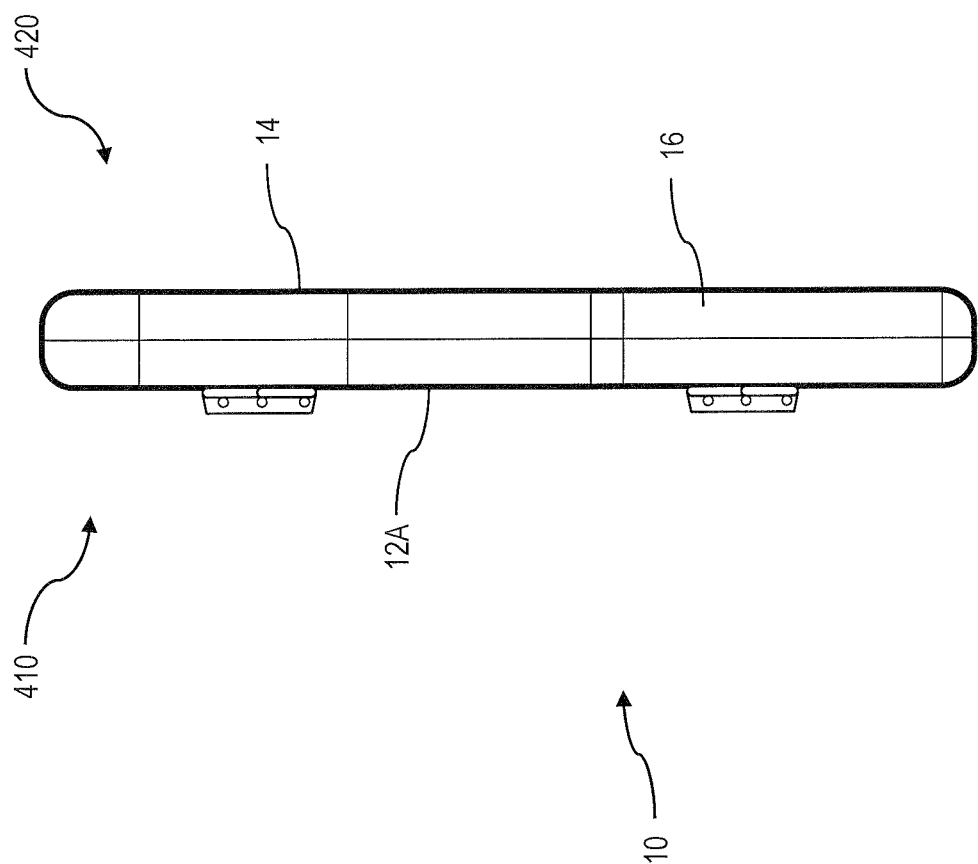
FIG. 4 is a side view of the interactive cabinet door, in accordance with the first embodiment of the present disclosure.

FIG. 4 is a side view of the interactive cabinet door 10, in accordance with the first embodiment of the present disclosure. The support frame 16 holds the interior components, separating the cabinet door 10 into front side 420 and back side 410. As shown in FIG. 4, on the front side 420, the support frame 16 and protective cover 14 are flush, with no gap, lip, or edge between the vertical planar faces of the protective cover 14 and support frame 16. Likewise, on the back side 410, the support frame 16 and PCB 12A are flush, with no gap, lip, or edge.

Figure 5B:
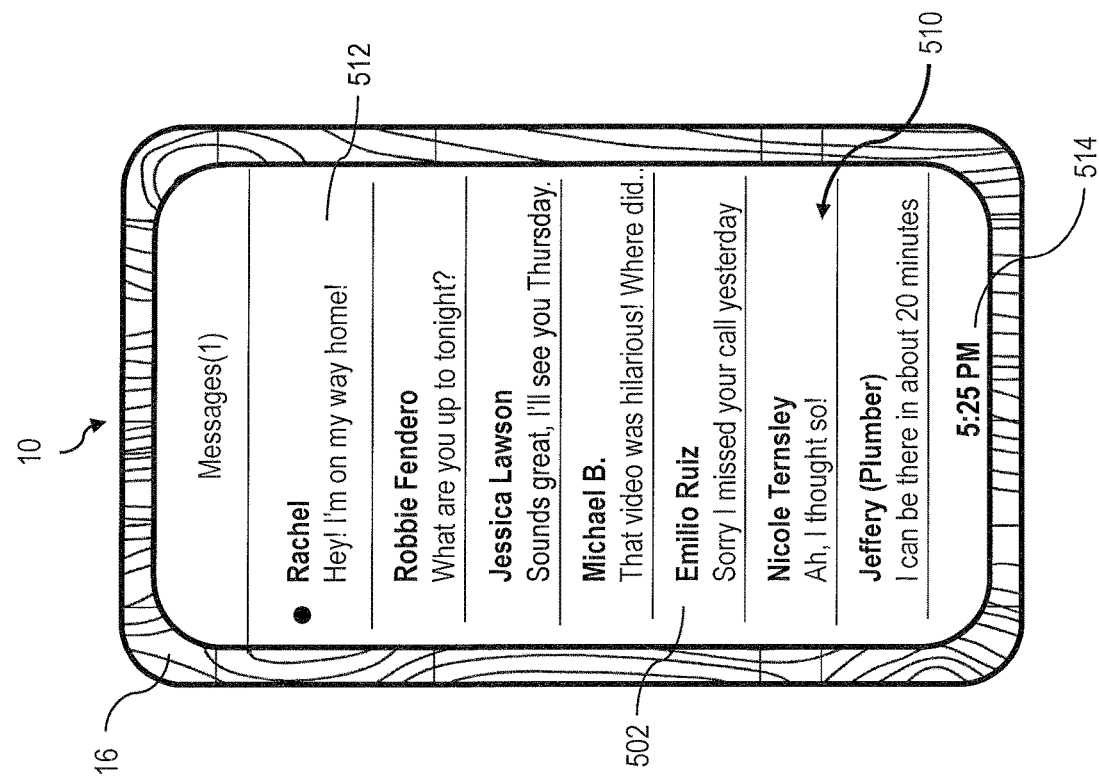
FIGS. 5A-5B are illustrations of the interactive cabinet door display, in accordance with the first embodiment of the present disclosure.
Figure 5A:
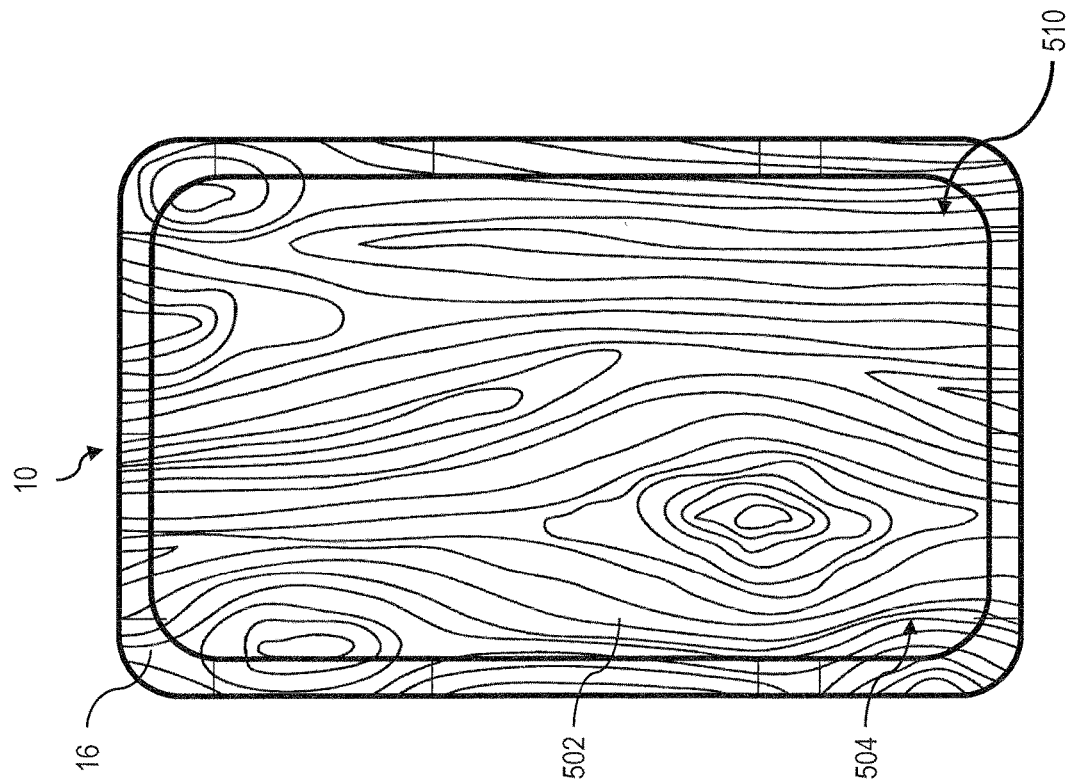

FIGS. 5A-5B are illustrations of the interactive cabinet door display 510, in accordance with the first embodiment of the present disclosure. FIG. 5A shows the cabinet door 10 in a "cabinet mode" of display. As an example, the cabinet door 10 may be styled to resemble a natural wooden cabinet such as may be found in a residential kitchen or bathroom. The support frame 16 may be made from wood or another material stylized to resemble the desired type of wood. The screen 502 of the cabinet door may be on, and the display 510 may be set to a mode resembling the style of the support frame 16. For instance, in FIG. 5A, the support frame 16 is shown having a noticeable wood grain pattern. The display 510 is also set to show this wood grain pattern 504 as though the support frame and screen 502 were made from a single sheet of wood. This may be useful when there are no images or other sources of information for the cabinet door 10 to display for the user, or when the user desires a more traditional cabinet aesthetic. Other support frame styles and patterns may be used, such as solid colors, materials such as glass and metal, landscape images to give the impression that the cabinet door 10 is a window, and so on. The cabinet door 10 may naturally revert to the "cabinet mode" display 510 after a period of inactivity, during a user-defined time of day, or upon command or input from the user.

FIG. 5B shows the cabinet door 10 in a "communication mode" of display. In this example, the cabinet door 10 may be wirelessly linked to a user's mobile device or messaging account, and may show incoming messages to the user when they are near the cabinet door 10. When the cabinet door 10 receives a message 512, the wood grain pattern 504 is no longer shown on the screen 502. Instead the display 510 changes to show the incoming message 512. Previous messages may be displayed as well. Depending on the size of the screen 502, preference of the user, and number of connected devices, display 510 may include additional display elements, such as the time 514, other messages from additional platforms, videos, images, and the like. For example, one portion of the screen 502 may show an episode of a television show, while another portion of the screen 502 shows a list of incoming messages, and yet another portion shows a recipe for use in the kitchen. In one example, after the message 512 has been seen or displayed long enough, the display 510 may revert back to the "cabinet mode" shown in FIG. 5A.

Figure 6:
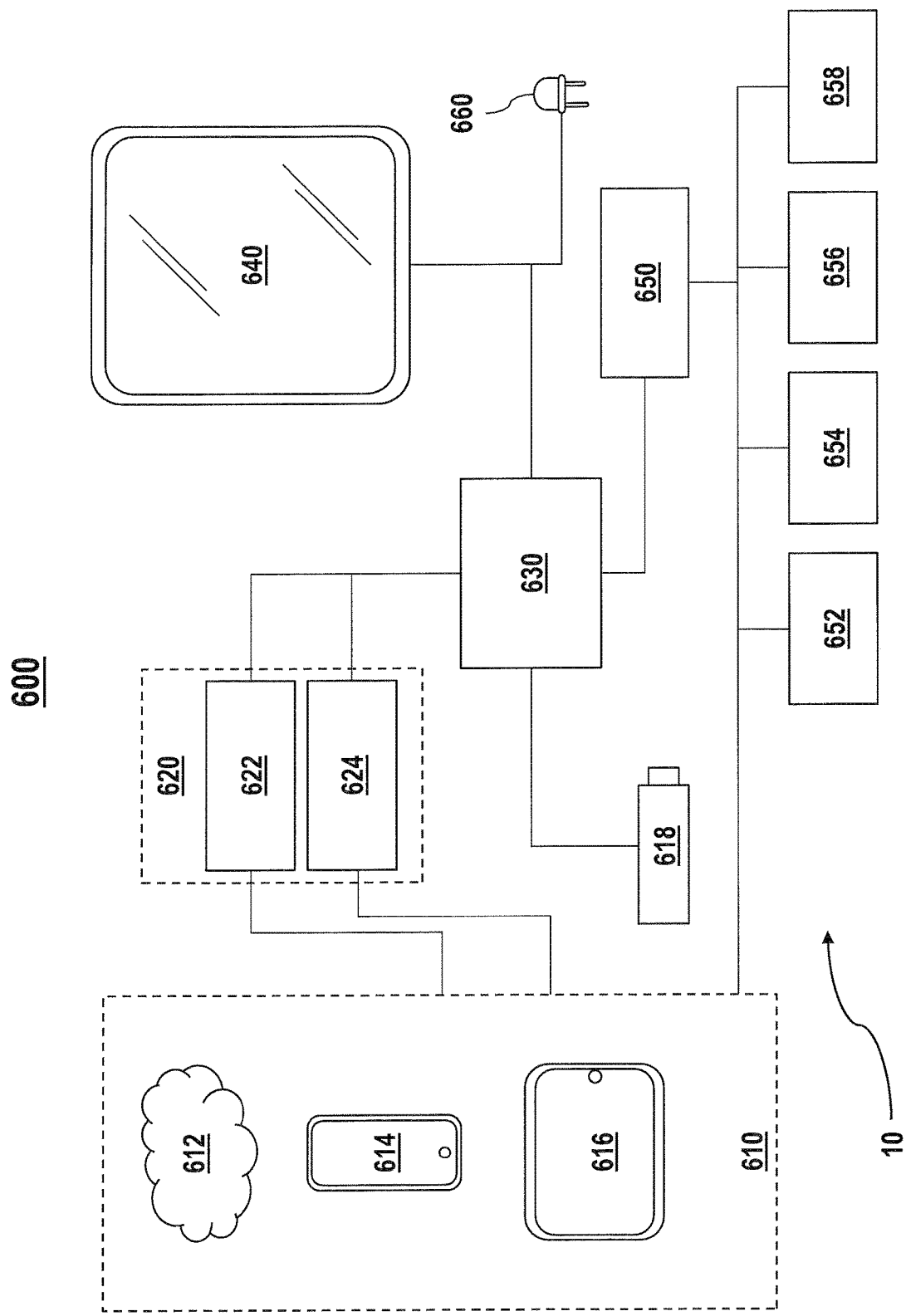
FIG. 6 is a box diagram showing the electronic and communications systems of the interactive cabinet door, in accordance with the first embodiment of the present disclosure.

FIG. 6 is a box diagram 600 showing the electronic and communications systems of the interactive cabinet door 10, in accordance with the first embodiment of the present disclosure. The processor 630 is in electrical communication with each of the other elements of the electronic and communications systems, including the antennas 620, display 640, sensors 660, and inputs 650. The processor 630 may be any suitable computer processor or processors, including those having ARM and x86 architectures. The antennas 620 may be any number and type of wireless antennas for transmitting and receiving wireless data with the cabinet door 10. This may include Wi-Fi®, Bluetooth®, NFC, cellular, and other radio wireless networks. Transmitter 622 may transmit data from the cabinet door 10 to one or more wirelessly connected devices 610, while receiver 624 may receive data from one or more connected devices 610. Wirelessly connected devices 610 may be any wireless devices, such as cloud-connected servers, servers, or machines 612, mobile phones 614, tablets 616, smartwatches, wearables, cameras, cable boxes, satellite networks, and the like. In one example, the processor 630 may establish a network connection with a mobile phone 614 in the area and a cloud-connected server 612. The mobile phone 614 may communicate text message and other communications data to the receiver 624, which may pass it to the processor 630 and display it on the display 640. If a user responds to the message using an input 650, the processor may send that response through the transmitter 622 and back to the mobile phone 614. At the same time, the cloud-connected server 612 may transmit a television show or movie through the receiver 624 using a service like Netflix®, Hulu®, and the like. The television show or movie may be displayed on the display 640 as well. Wired devices may be connected to the processor 630, as discussed relative to FIG. 3, above. For instance, a video stick such as an Amazon Fire Stick® may be connected to the HDMI and USB ports on the cabinet door 10, and may stream content to the display 640.

The processor 630 may receive input from one or more input sources 650. The input sources 650 may be directly or indirectly connected to the processor 630. For example, a direct input source may be a keyboard 652, touchscreen interface 654, camera 656, or microphone 658. The keyboard 652 may record keystrokes and cursor movement as on a traditional computer. The touchscreen may be a capacitative, touch-sensitive element built into the protective cover 14 or the electronic display 12. The touchscreen may provide a user interface that is responsive to a user's touch. The camera 656 may receive input by determining whether a user is present, identifying whether the user is looking at the cabinet door 10, responding to user motions and signals, or showing content according to a user's eye movements. For example, if a user is not detected by the camera 656, the display 640 may remain off, in a low-power state, or in "cabinet mode". If a user is in the vicinity of the cabinet door 10 but not looking at the cabinet door 10, the display 640 may not show video or time-sensitive content. If the user is looking at one cabinet door 10 in a room having multiple cabinet doors 10, the processor may show content on only that particular cabinet door. This may require a connected or distributed network of cabinet doors 10 within a particular room, such that each cabinet door 10 is in communication with one or more additional cabinet doors 10. The microphone 658 may be used to record a user's voice commands or detect the presence of a user. Voice commands may be parsed by the processor 630 and sent to the appropriate connected device. An indirect input source may be the input sources of the wirelessly connected devices 610, such as the touch keyboards, gestures, voice commands, and the like. A user may control the function of the cabinet door 10 by entering input through a connected device, like a mobile phone 614. Additionally, the input 650 may be a remote control operating using the infrared or radio spectrums.

The display 640 may be the display screen 12B shown in FIG. 1. It may be connected to the processor 630, which may control what content the display 640 shows. As discussed above, the display 640 may show various different types of content on more or more areas of the screen. In one example, a portion of the screen may always remain dedicated to a utility such as a clock, timer, weather display, and the like. The user may determine when multiple types of display content are displayed and how they are arranged. For example, a user may be watching a television show while also consulting a recipe while cooking in a kitchen. The television show may be displayed on a significant portion of the display 640, while the recipe is displayed in a small area step by step. In another example, the user may receive a video phone call, and may minimize the television show while keeping the video phone call and recipe prominently displayed.

The cabinet door 10 may further include one or more sensors 660 to detect object, person, and environmental conditions in the vicinity of the cabinet door 10. As an example, sensors may include temperature sensors, carbon monoxide and carbon dioxide sensors, humidity sensors, weight sensors, motion detectors, RFID or barcode scanners, cabinet content detectors, and the like. A temperature sensor may detect the temperature in the vicinity of the cabinet door 10 and report the information to a user or a connected smart thermostat. If the temperature spikes sharply upward, indicating a fire, the cabinet door may contact appropriate authorities to deal with the matter. A carbon monoxide and/or dioxide sensor may detect the presence of deadly gases within the vicinity of the cabinet door 10 and alert a user if levels peak above a specified threshold. A humidity sensor may detect the presence of water in the air or on the device and may report this information to the user or a connected smart thermostat. If significant water is detected, the cabinet door 10 may alert the user to the presence of a leak. A weight sensor may detect the weight of the contents of the cabinet to which the cabinet door 10 is attached. If the weight drops below a certain threshold, the cabinet door 10 may alert the user that they need to restock on certain supplies, or that they need to clean and replace dishware. A motion sensor may detect motion in the vicinity of the cabinet door 10. For example, if a user is away from the house and the cabinet door 10 detects motion in the house, the device may alert the user that there is unauthorized entry to the house. An RFID or barcode scanner may scan enabled items that are placed within the connected cabinet and maintain a digital list of supplies. When an item has been removed from the cabinet and not replaced, the cabinet door 10 may detect this and alert the user to buy more of the item when they go to the store next. Additionally, the user may be able to easily find catalogued items by searching within the interface of the cabinet door 10. The cabinet door 10 may indicate, graphically, or by visual display, where the desired item is stored. Cabinet content detectors may be visual or infrared ranging detectors that can scan the contents of a cabinet and determine the nature of the contents based on the imaged properties recorded by the detector. The cabinet door 10 may automatically detect items located within the cabinet and may catalog or track usage accordingly. The cabinet door 10 may include one or more of each such sensor, depending on the construction and intended use of the cabinet door 10. The microphone 658 may additionally be a sensor that can be used to detect the presence of persons in the vicinity of the cabinet door 10.

Figure 7:
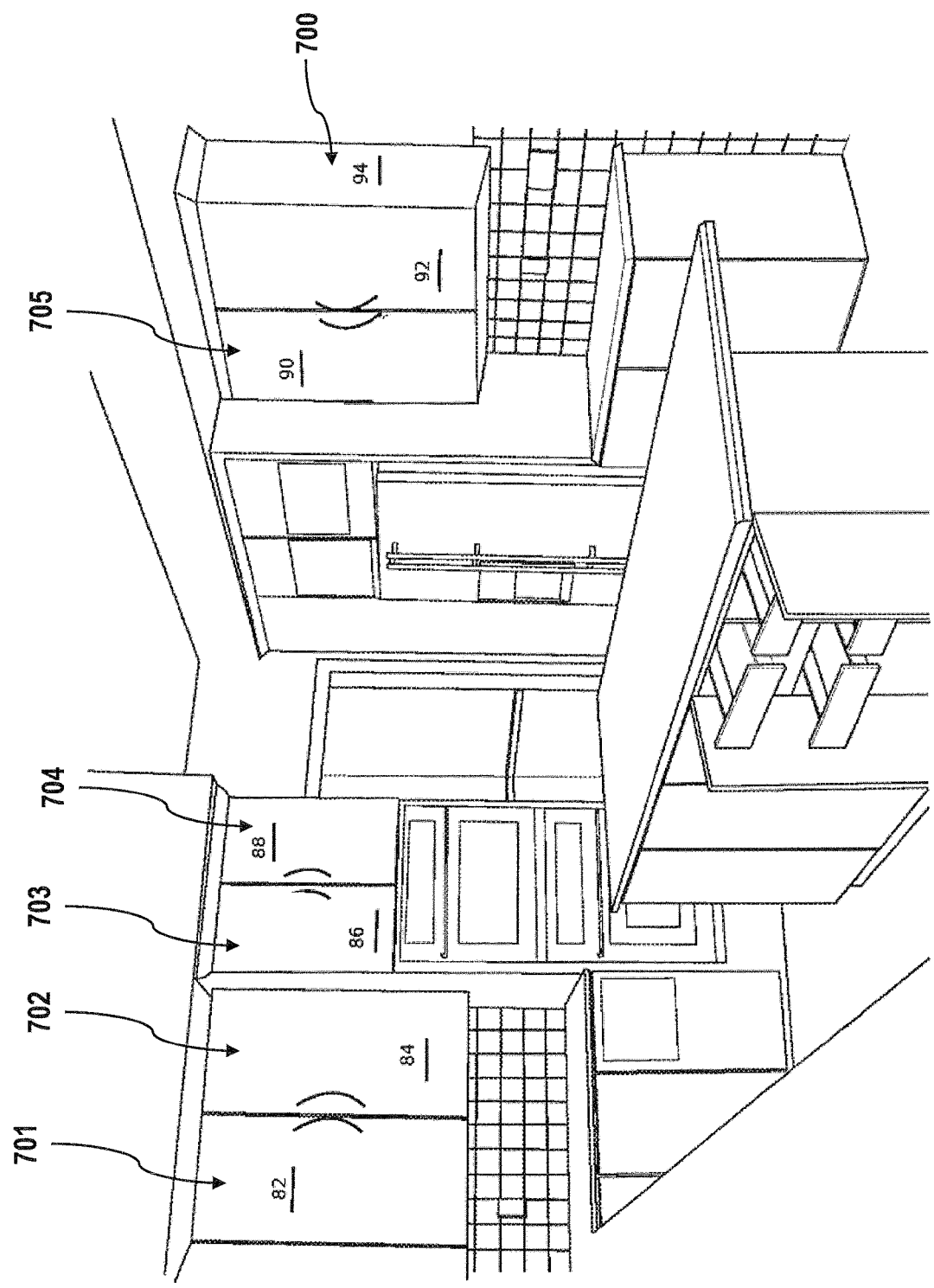
FIG. 7 is an exemplary view of an interactive cabinet system within a residential kitchen, in accordance with a second exemplary embodiment of the present disclosure.

FIG. 7 is an exemplary view of an interactive cabinet system 700 within a residential kitchen, in accordance with a second exemplary embodiment of the present disclosure. The cabinet system 700 may include an interactive cabinet door 92, constructed as previously discussed in reference to FIGS. 1-6, above. The interactive cabinet door 92 may be coupled to a cabinet base 94. The cabinet base 94 includes a plurality of cabinet walls, a cabinet top, and a cabinet bottom all joined to create a hollow enclosure having an opening sized to allow the support frame and assembled screen of the interactive cabinet door 92 to cover the opening. The at least one mounting bracket of the interactive cabinet door 92 couples the interactive cabinet door 92 to a cabinet wall of the cabinet base 94. FIG. 7 shows a cabinet system 700 in a home kitchen, in use among additional cabinet systems 701, 702, 703, 704, 705. The systems 700-705 include interactive cabinet doors 82, 84, 86, 88, 90, 92. The cabinet doors 82-92 may be communicably coupled with local or remote connection sources as discussed relative to FIG. 6, above. For example, a remote application service system vis-a-vis a router, a cable set-top box, or many other options available in the market, may be connected via wireless connection, e.g. over a HDMI wireless interface. The cabinet doors 82-92 are physically attached to their respective cabinet bases, e.g. cabinet base 94. The cabinet doors 82-92 allow the user to be digitally and interactively connected throughout the home.

In one example, a cabinet may be defined as a cabinet base 94 in conjunction with a cabinet door 92. A cabinet may generally be a simple, hollow enclosure for storage of small and medium items. A cabinet is not equivalent to an oven, refrigerator, microwave, or other electronic appliance. In many cases, a cabinet may not be previously connected for power, or may only be connected for minimal interior lighting. A cabinet may be commonly found in kitchens, bathrooms, and storage rooms. The aesthetic design of a cabinet may be of notable concern to most users. Generally, users desire the cabinet door and cabinet base to match in appearance and style in order to form a coherent design theme in the room where the cabinet is located. This is why it is particularly important that the components of the interactive cabinet system 700 appear to be of a unitary, continuous design.

FIG. 8 is a flowchart 800 showing a method of displaying image data on an interactive cabinet door, in accordance with a third embodiment of the present disclosure. It should be noted that any process descriptions or blocks in flow charts should be understood as representing modules, segments, portions of code, or steps that include one or more instructions for implementing specific logical functions in the process, and alternate implementations are included within the scope of the present disclosure in which functions may be executed out of order from that shown or discussed, including substantially concurrently or in reverse order, depending on the functionality involved, as would be understood by those reasonably skilled in the art of the present disclosure.

Step 810 includes providing an interactive cabinet door comprising: an electronic display, comprising an electronic display screen in communication with a printed circuit board substrate (PCB), the PCB having a display data receiver thereon; a protective cover sized to cover substantially all of a front face of the electronic display, wherein the protective cover and the electronic display together form an assembled screen having a peripheral edge substantially perpendicular to the front face of the electronic display and running along the entirety of the assembled screen; a support frame covering the peripheral edge of the assembled screen and biased against the peripheral edge of the assembled screen, wherein the support frame is flush with front and back faces of the assembled screen; and at least one mounting bracket affixed to a back side of the support frame and coupleable to a cabinet base.

Step 820 includes displaying, on the electronic display, a cabinet state image corresponding to the appearance of the support frame and creating visual continuity from a first end of the support frame to a second end of the support frame. The cabinet state image may show the aesthetic style or design pattern of the support frame, as discussed relative to FIGS. 5A-5B, above. This may include an image corresponding to wood grain and appearance, metal, glass, plastic, paint colors, and other design elements. The image may cause the combination of the electronic display and the support frame to appear as though they are a single piece of continuous material from a first end of the support frame, such as the top end, to the second end of the support frame, such as the bottom end. Step 820 may include adjustments to brightness, contrast, and color of the original image data in order to match the support frame more precisely. This may be automatically performed by the cabinet door or manually performed by the user.

Step 830 includes receiving image data with the display data receiver. The image data may be still images, videos, notifications, communications, and the like. The image data may be received from a wireless or wired connected source as described relative to FIG. 6, above.

Step 840 includes adjusting at least a portion of the electronic display to display the received image data. Depending on the size and importance of the received image data, only a portion of the electronic display may be changed to display the received image data. For instance, if the received image data is a visual representation of a text communication, a small portion of the electronic display may be made to stop displaying the cabinet state image and instead display the visual representation of the text communication. If the received image data is a video, then a larger portion of the electronic display, including up to the entire display area, may be adjusted to display the new data. In one example, the entire cabinet state image may be removed when any received image data is displayed.

Step 850 includes returning the at least a portion of the electronic display to the cabinet state image. Once the received image data has been sufficiently displayed, the electronic display may revert back to the cabinet state image. For example, a text communication may only show for several seconds before the display returns to the cabinet state image entirely. This may be based on a timeout count that is predetermined based on the nature of the communication, the length of the communication, or other relevant factors. In another example, a user may indicate that they have finished interacting with the electronic display, and this may cause the display to return to the cabinet state image.

The method may further include any other features, components, or functions disclosed relative to any other figure of this disclosure.

It should be emphasized that the above-described embodiments of the present disclosure, particularly, any "preferred"

embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. An interactive cabinet door for use with a cabinet base, the cabinet door comprising:
    an electronic display, comprising an electronic display screen in communication with a printed circuit board substrate (PCB), the PCB having a processor and a display data receiver thereon;
    a camera or microphone for recording user commands or user actions, and speakers for playing audio, integrated on the PCB;
    a protective cover sized to cover substantially all of a front face of the electronic display, wherein the protective cover and the electronic display together form an assembled screen having a peripheral edge substantially perpendicular to the front face of the electronic display and running along the entirety of the assembled screen;
    a support frame covering the peripheral edge of the assembled screen and biased against the peripheral edge of the assembled screen, wherein the support frame is formed of wood or a material stylized to resemble wood, and is flush with front and back faces of the assembled screen; and
    at least one mounting bracket affixed to a back side of the support frame and coupleable to the cabinet base,
    wherein the processor is configured to generate signals to cause the display to produce a first cabinet mode image that corresponds with an appearance of the support frame and the cabinet base and creates visual continuity from a first end of the support frame to a second end of the support frame and the cabinet base in a first, low power state, and to produce image data different from the first cabinet mode image data in a second, higher power state.

2. The interactive cabinet door of claim 1, wherein the support frame comprises a first support frame piece and a second support frame piece, and wherein the first and second support frame pieces are coupled together to cover the entire peripheral edge of the assembled screen.

3. The interactive cabinet door of claim 2, wherein the first support frame piece is biased against the peripheral edge of the assembled screen at a different biasing force than the second support frame piece.

4. The interactive cabinet door of claim 1, further comprising a user input device.

5. The interactive cabinet door of claim 4, wherein the user input device is one selected from the group consisting of: a keyboard, a touchscreen, a camera, and a microphone.

6. The interactive cabinet door of claim 4, wherein the user input device is a mobile device.

7. The interactive cabinet door of claim 1, wherein the display data receiver is in communication with a plurality of connected devices.

8. The interactive cabinet door of claim 1, further comprising at least one sensor selected from the group consisting of: temperature sensors, carbon monoxide sensors, carbon dioxide sensors, humidity sensors, weight sensors, motion sensors, RFID scanners, barcode scanners, microphones, and ranging detectors.

9. An interactive cabinet system, comprising:
    an electronic display, comprising an electronic display screen in communication with a printed circuit board substrate (PCB), the PCB having a processor and a display data receiver thereon;
    a camera or microphone for recording user commands or user actions, and speakers for playing audio, integrated on the PCB;
    a protective cover sized to cover substantially all of a front face of the electronic display, wherein the protective cover and the electronic display together form an assembled screen having a peripheral edge substantially perpendicular to the front face of the electronic display and running along the entirety of the assembled screen;
    a support frame covering the peripheral edge of the assembled screen and biased against the peripheral edge of the assembled screen, wherein the support frame is formed of wood or a material stylized to resemble wood, and is flush with front and back faces of the assembled screen;
    a cabinet base comprising a plurality of cabinet walls, a cabinet top, and a cabinet bottom all joined to create a hollow enclosure having an opening sized to allow the support frame and assembled screen to cover the opening;
    at least one mounting bracket affixed to a back side of the support frame and coupled to a cabinet wall of the cabinet base; and
    a power source in electronic communication with the electronic display,
    wherein the processor is configured to generate signals to cause the display to produce a first cabinet mode image that corresponds with an appearance of the support frame and the cabinet base and creates visual continuity from a first end of the support frame to a second end of the support frame and the cabinet base in a first, low power state, and to produce image data different from the first cabinet mode image data in a second, higher power state.

10. The system of claim 9, wherein the support frame comprises a first support frame piece and a second support frame piece, and wherein the first and second support frame pieces are coupled together to cover the entire peripheral edge of the assembled screen.

11. The system of claim 10, wherein the first support frame piece is biased against the peripheral edge of the assembled screen at a different biasing force than the second support frame piece.

12. The system of claim 9, further comprising a user input device.

13. The system of claim 12, wherein the user input device is one selected from the group consisting of: a keyboard, a touchscreen, a camera, and a microphone.

14. The system of claim 12, wherein the user input device is a mobile device.

15. The system of claim 9, wherein the display data receiver is in communication with a plurality of connected devices.

16. The system of claim 9, further comprising at least one sensor selected from the group consisting of: temperature sensors, carbon monoxide sensors, carbon dioxide sensors, humidity sensors, weight sensors, motion sensors, RFID scanners, barcode scanners, microphones, and ranging detectors.

17. A method of displaying image data on an interactive cabinet door for use with a cabinet base, comprising the steps of:
   providing an interactive cabinet door comprising:
   an electronic display, comprising an electronic display screen in communication with a printed circuit board substrate (PCB), the PCB having a processor and a display data receiver thereon;
   a camera or microphone for recording user commands or user actions, and speakers for playing audio, integrated on the PCB;
   a protective cover sized to cover substantially all of a front face of the electronic display, wherein the protective cover and the electronic display together form an assembled screen having a peripheral edge substantially perpendicular to the front face of the electronic display and running along the entirety of the assembled screen;
   a support frame covering the peripheral edge of the assembled screen and biased against the peripheral edge of the assembled screen, wherein the support frame is formed of wood or a material stylized to resemble wood, and is flush with front and back faces of the assembled screen; and
   at least one mounting bracket affixed to a back side of the support frame and coupleable to a cabinet base;
   displaying, on the electronic display, in a first lower power state, a cabinet state image corresponding to an appearance of the support frame and the cabinet base and creating visual continuity from a first end of the support fume to a second end of the support frame and the cabinet base;
   receiving image data with the display data receiver;
   adjusting at least a portion of the electronic display in a second higher power state, to display the received image data different from the cabinet state image; and
   returning the at least a portion of the electronic display to the cabinet state image.

18. The method of claim 17, wherein the portion of the electronic display adjusted to display the received image data is less for image data corresponding to a text communication than for image data corresponding to a video.

19. The method of claim 17, wherein the electronic display returns to the cabinet state image after a predetermined timeout count.

20. The method of claim 17 wherein the electronic display returns to the cabinet state image after a user indicates they have finished interacting with the electronic display.

* * * * *